(12) United States Patent
Takai

(10) Patent No.: US 7,719,370 B2
(45) Date of Patent: May 18, 2010

(54) VOLTAGE CONTROLLED OSCILLATOR

(75) Inventor: Yasuhiro Takai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/031,809

(22) Filed: Feb. 15, 2008

(65) Prior Publication Data

US 2008/0197932 A1 Aug. 21, 2008

(30) Foreign Application Priority Data

Feb. 20, 2007 (JP) .................. P2007-039025

(51) Int. Cl.
*H03K 3/03* (2006.01)

(52) U.S. Cl. .................. 331/57; 331/11; 331/45; 331/183

(58) Field of Classification Search .............. 331/57, 331/11, 45, 183; 327/65, 280, 287
See application file for complete search history.

(56) References Cited

U.S. PATENT DOCUMENTS 7,233,214 B2 * 6/2007 Kim et al. .................. 331/176
7,400,183 B1 * 7/2008 Sivadasan et al. ........... 327/261
2005/0253659 A1 * 11/2005 Favrat et al. ................. 331/57
2008/0036551 A1 * 2/2008 Kim ........................... 331/183
2008/0129393 A1 * 6/2008 Rangan et al. ............... 331/57

OTHER PUBLICATIONS

William J. Dally et al., Digital Systems Engineering Basic Editions:, trans. Tadahiro Kuroda, Maruzen, Mar. 30, 2003, pp. 746-748.

* cited by examiner

*Primary Examiner*—Joseph Chang
*Assistant Examiner*—Jeffrey Shin
(74) *Attorney, Agent, or Firm*—Young & Thompson

(57) ABSTRACT

A voltage controlled oscillator that is a differential ring oscillator type voltage controlled oscillator that, by connecting in cascade differential delay elements to which differential clock signals of a mutually reverse phase are input and controlling the current that flows to the differential delay elements by a bias voltage, controls a delay amount of this differential clock signal, having a phase detection portion that outputs a detection signal by comparing an output voltage of the differential output of any differential delay element and a reference voltage that is set to a voltage that detects an abnormal operation, and a cross-coupled circuit that is provided at each of the differential delay elements and, when the detection signal is input, amplifies the potential difference between the pair of differential output terminals.

10 Claims, 11 Drawing Sheets

(a)

(b)

VOLTAGE CONTROLLED OSCILLATOR

BACKGROUND OF THE INVENTION

1. Field of the Invention

The present invention relates to a voltage controlled oscillator capable of changing an oscillation frequency with a control voltage.

Priority is claimed on Japanese Patent Application No. 2007-39025, filed Feb. 20, 2007, the content of which is incorporated herein by reference.

2. Description of Related Art

A voltage controlled oscillator (VCO) has generally been used as a circuit for generating digital waveforms.

In particular, a VCO with the structure shown in FIG. 9 that uses differential delay elements shown in FIGS. 8A and 8B has been widely employed as a phase locked loop (PLL) for internal clock generation in a synchronous LSI (for example, refer to William J. Dally and John W. Poulton, "Digital Systems Engineering Basic Edition", trans. Tadahiro Kuroda, Maruzen, Mar. 30, 2003, p. 747).

In the above-mentioned differential delay element, an N-channel type MOS transistor N100 into which a bias voltage signal NBIAS is inputted is used as a constant current source that provides a constant current I. Moreover, this differential delay element consists of P-channel type MOS transistors P100 and P101 into which a bias signal PBIAS is input, and diode-connected P-channel type MOS transistors P102 and P103 that are connected in parallel to the MOS transistors P100 and P101, respectively. This parallel circuit forms resistance of resistance value R.

The VCO shown in FIG. 9 operates with the gap between the differential nodes (the point of turnback at the maximum value and minimum value of the oscillating wave) being amplitude RI(=VDD−Vlow, with VDD being the power supply voltage, which is the maximum voltage in the output waveform, and Vlow being the minimum voltage in the output waveform).

By adjusting the abovementioned bias voltage signals NBIAS and PBIAS and mainly controlling the current value I, the propagation period (namely, delay time) of the differential delay element is changed, and so the oscillating frequency of the VCO is changed.

The signals CT1 to CT8 and CB1 to CB8 that are output from each of the differential delay elements 101 to 108 propagate while being delayed in turn by the differential delay elements of the next stage as in the waveform shown in FIG. 10. Thereby, it is possible to generate a multi-phase clock signal in which the signal CT4 has a phase difference of 90 degrees, the signal CB8 has a phase difference of 180 degrees, and the signal CB4 has a phase difference of 280 degrees with respect to the signal CT8 in a locked state of the frequency being stabilized.

Moreover, the phase difference of the outputs between the adjacent differential delay elements is 22.5 degrees (360 degrees/16). By interpolating this phase difference, it is possible to readily generate a multiphase clock that is synchronized with a signal that differs from the reference clock of the PLL.

However, the VCO mentioned above may fall into a false oscillation state in which the phase differences between the differential delay elements shift from the design values due to the reason given below.

That is, since each of the differential delay elements (101 to 108 of FIG. 9) shown in FIGS. 8A and 8B has a small phase difference with another adjacent differential delay element, feedback is not applied to the voltage of the output terminals OUTP and OUTM other than weak feedback.

For that reason, as shown in FIG. 11, in the differential delay elements (101 to 108) that form the VCO by being connected in series, a metastable condition exists in which the signal waveforms of CTi, CBi that are even numbered (i=2, 4, 6, 8) are all in the same phase, while the signal waveforms of the odd-numbered CTj, CBj (j=1, 3, 5, 7) are in a reverse phase of the signal waveforms of the even-numbered CTi, CBi (first problem).

The phenomenon above easily occurs in the case of lowering the bias voltage signal in order to perform control that lowers the operating frequency of the VCO and dropping the gain of the differential delay elements. In this false oscillation state, the VCO cannot generate and output the intended multiphase clock as a designed value. That is, the phases of adjacent differential delay elements shift by 180 degrees each, leading to a state of the normal phase difference of 22.5 degrees between adjacent differential delay elements not being satisfied.

Moreover, the VCO may enter the metastable oscillation state as shown in FIG. 12. This false oscillation state is a stable state in which CTi (i is even number) and CBi all become the "L" level low-voltage level Vlow, and CTj (j is odd number) and CBj all become the "H" level high-voltage level VDD (second problem).

Also in this case, it is not possible to generate the intended multiphase clock as in the case of FIG. 11 and not possible to readily escape from the metastable state, and so returning to the normal oscillation state is difficult.

SUMMARY OF THE INVENTION

The present invention was achieved in view of the above circumstances, and has as its object to provide a VCO that is able to detect the operation entering a false oscillation state or metastable state and is able to get out of the false oscillation state or metastable state into a normal oscillation state.

The voltage controlled oscillator of the present invention is a differential ring oscillator type voltage controlled oscillator, including:

a plurality of differential delay elements that each have a pair of differential input terminals, a pair of differential output terminals, and a bias input terminal, with clock signals of a mutually reverse phase input to the pair of differential input terminals; a phase detection portion that is connected to the differential output terminals of one differential delay element for detection among the plurality of differential delay elements, detects an abnormal oscillation by comparing an output voltage of the differential output terminals and a reference voltage that is set to a voltage that detects an abnormal operation and outputs a detection signal; a cross-coupled circuit that is provided at each of the differential delay elements and connected to the phase detection portion, and, when the detection signal is input, amplifies the potential difference between the pair of differential output terminals; wherein by connecting in cascade the plurality of differential delay elements at the differential input terminals and the differential output terminals and controlling the amount of current that flows to the differential delay elements by a bias voltage that is impressed on the bias input terminal, the voltage controlled oscillator controls the delay amount of the clock signal.

According to the present invention, in the case of a metastable state ocurring in which the pair of differential outputs CTi, CBi (i is an even number) are all of the same phase, and the pair of differential outputs CTj, CBj (j is an odd number) are all of a reverse phase to the differential outputs CTi, CBi, so that a normal multiphase clock cannot be generated, the cross-coupled circuit is driven by the detection signal, a slight voltage difference between the pair of differential outputs is positively fed back, and the pair of differential outputs enter an unstable state. Thereby, since a return to a normal oscillation mode is enabled, it is possible to provide a stable voltage controlled oscillator with a wide operating frequency margin.

DETAILED DESCRIPTION OF THE INVENTION

First Embodiment

Figure 1A:
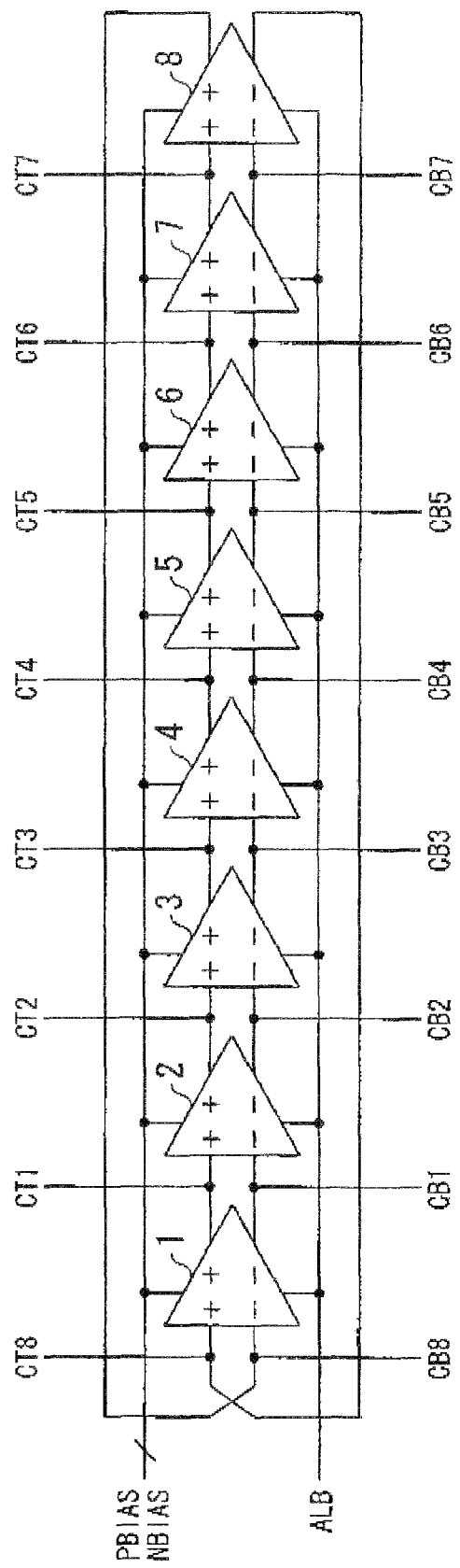
FIG. 1A is a circuit diagram showing a VCO according to a first embodiment of the present invention.

Hereinbelow, a differential ring oscillator type voltage controlled oscillator (VCO) according to the first embodiment of the present invention shall be described with reference to the drawings. FIG. 1A is a block drawing that shows configuration examples of a differential ring oscillator in which differential delay elements 1, 2, 3, 4, 5, 6, 7, 8 according to the first embodiment are connected in cascade. Mutually reverse clock signals are input as differential signals from the previous stage to each of the differential delay elements 1 to 8. Each of the differential delay elements 1 to 8 delays this clock signal by a predetermined delay amount, outputs a differential signal to the following stage, and outputs a multiphase clock signal that corresponds to the delay amount.

In this drawing, bias voltages PBIAS and NBIAS are input to each differential delay element. A first differential output terminal of differential delay element n is denoted as CTOn, a second differential output terminal as CBOn, while a first differential input terminal is denoted as CTIn and a second differential input terminal as CBIn. In the differential delay elements 1 to 8, the differential output terminal CTOi (i is an even number, being 2, 4, 6 in the present embodiment) is connected to the differential input terminal CTIj (j is an odd number, being 1, 3, 5, 7 in the present embodiment) of the following stage, and the differential output terminal CBOi is connected to the differential input terminal CBIj. By adjusting the abovementioned bias voltages PBIAS and NBIAS, the current that flows to a differential delay element is controlled so as to become the delay amount corresponding to the operating frequency.

The differential output terminal CTO8 of the differential delay element 8, which is the final stage in the cascade connection of the ring oscillator, is connected to differential input terminal CBI0 of the initial stage, and differential output terminal CBO8 is connected to the differential input terminal CTI0 of the initial stage. Thus, differential signals CT1, CT2, CT3, CT4, CT5, CT6, CT7, and CT8 are output from the differential output terminals CTO1, CTO2, CTO3, CTO4, CTO5, CTO6, CTO7, and CTO8, respectively.

Moreover, differential signals CB1, CB2, CB3, CB4, CB5, CB6, CB7, and CB8 are output from the differential output terminals CBO1, CBO2, CBO3, CBO4, CBO5, CBO6, CBO7, and CRO8, respectively.

In the above-mentioned differential delay elements 1 to 8, the delay amount changes depending on the control voltage. The differential delay elements 1 to 8 of the eight stages are connected in cascade, and connected so that the phase of the differential output CTO8 (and CBO8) of the differential delay element 8, which is the final stage, and the phase of the differential input CBI1 (CTI1) of the differential delay element 1, which is the initial stage, are in agreement. For this reason, the multiphase clock that is output from the differential delay elements 1 to 8 is formed by clocks of the same cycle being delayed by each differential delay element and transmitted in turn, resulting in an eight-phase portion multiphase clock with each movement shifted by 1/8 phase.

Figure 1B:
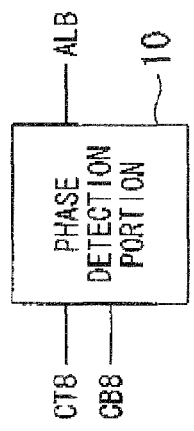
FIG. 1B is a circuit diagram showing the phase detection portion according to a first embodiment of the present invention.

Referring to FIG. 1B, the differential signals CT8, CB8 are input to the differential inputs CTI1 and CBI1 of the differential delay element 1, and the phase detection portion 10 detects whether or not the phases of both agree. In the case of detecting that they agree, it outputs a detection signal ALB.

Figure 2B:
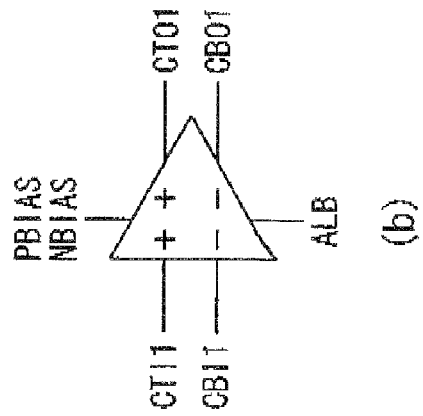
FIG. 2B is a circuit diagram that shows the differential delay element that is shown in FIG. 1A.
Figure 2A:
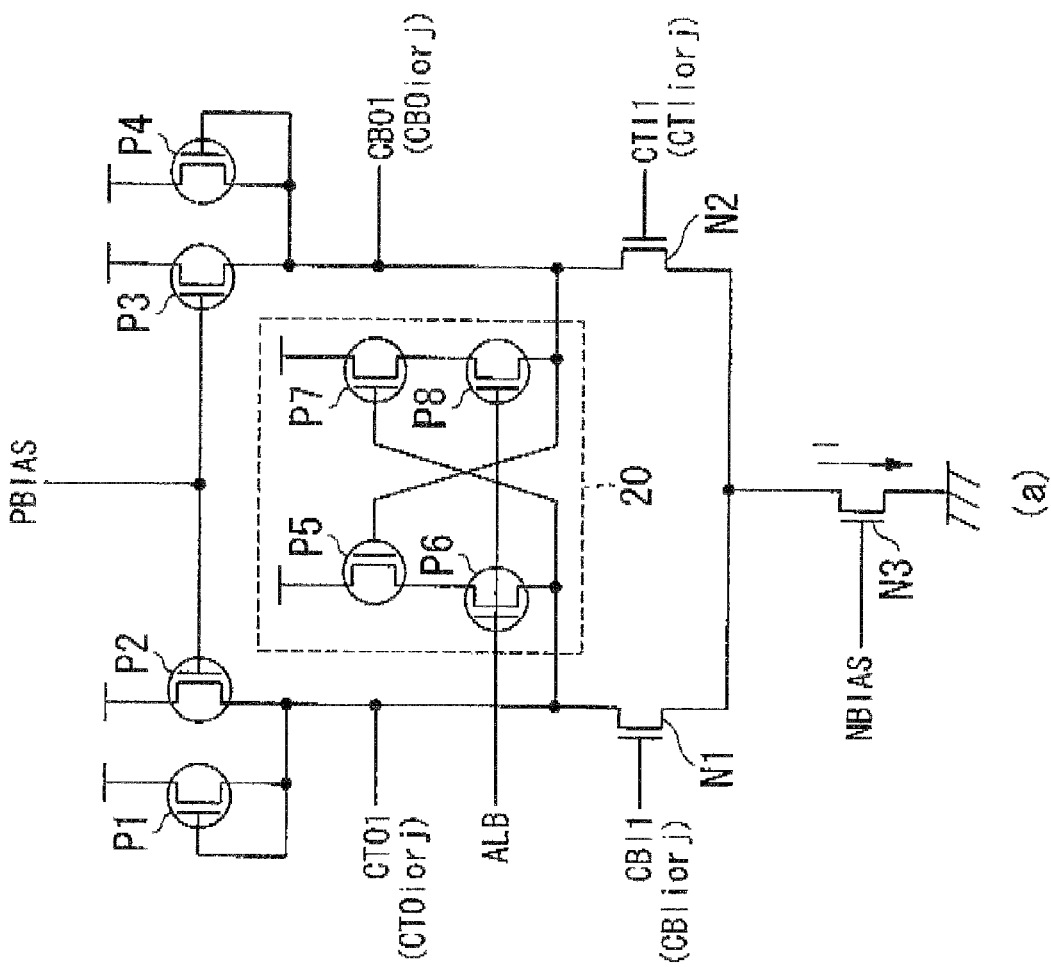
FIG. 2A is a circuit diagram showing the circuit configuration of the differential delay element that is shown in FIG. 1A

Next, the constitution of the differential delay elements 1 to 8 shown in FIG. 1A shall be described in detail, referring to FIG. 2A. FIG. 2A is a conceptual drawing that describes the circuit configuration of the differential delay element in FIG. 1A, and FIG. 2B is a conceptual drawing showing the symbols of the differential delay element in FIG. 1A. In the following description, although the differential delay element 1 is explained as a representative, the other differential delay elements 2 to 8 also have the same configuration.

In FIG. 2A, the differential delay element 1 is constituted from N-channel type MOS transistors N1, N2, N3, P-channel type MOS transistors P1, P2, P3, P4, and a cross-coupled circuit 20.

The MOS transistor P1 is a diode-connected transistor in which the gate is connected to the drain, and is connected in parallel with the MOS transistor P2, with the source being connected to the power supply line (VDD), and the drain being connected to the differential output CTO1 (i or j).

In the MOS transistor P2, the bias voltage PBIAS is impressed on the gate, the source is connected to the power supply line, and the drain is connected to the differential output CTO1.

The load of the MOS transistor N1, which is a differential transistor, is formed by the MOS transistor P1 and the MOS transistor P2 mentioned above.

The MOS transistor P4 is the same transistor size as the MOS transistor P1, and is a diode-connected transistor in which the gate is connected to the drain. The MOS transistor P4 is connected in parallel with the MOS transistor P3, with the source being connected to the power supply line, and the drain being connected to the differential output CBO1.

In the MOS transistor P3, which is the same transistor size as the MOS transistor P2, the bias voltage PBIAS is impressed on the gate, the source is connected to the power supply line, and the drain is connected to the differential output CBO1.

The load of the MOS transistor N2, which is a differential transistor, is formed by the MOS transistor P3 and the MOS transistor P4 mentioned above.

As for the MOS transistor N1, the drain is connected to the differential output CTO1, and the gate is connected to the differential input CBI1.

In the MOS transistor N2, which is the same transistor size as the MOS transistor N1, the drain is connected to the differential output CBO1, and the gate is connected to the differential input CTI1.

In the MOS transistor N3, the source is grounded, the bias voltage NBIAS is impressed on a gate, and the drain is connected to the source of the MOS transistors N1 and N2.

The cross-coupled circuit 20 is constituted from P-channel type MOS transistors P5, P6, P7, and P8.

In the MOS transistor P5, the source is connected to the power supply line, and the gate is connected to the differential output CBO1, which is one of the pair of differential outputs of the differential delay element 1.

In the MOS transistor P6, the source is connected to the drain of the MOS transistor P5, the detection signal ALB is impressed on the gate, and the drain is connected to the differential output CTO1, which is the other of the pair of differential outputs of the differential delay element 1.

In the MOS transistor P7, which is the same transistor size as MOS transistor P5, the source is connected to the power supply line, and the gate is connected to the differential output CTO1, which is the other of the pair of differential outputs of the differential delay element 1.

In the MOS transistor P8, which is the same transistor size as the MOS transistor P6, the source is connected to the drain of the MOS transistor P7, the detection signal ALB is impressed on the gate, and the drain is connected to the differential output CBO1, which is one of the pair of differential outputs of the differential delay element 1.

Figure 3:
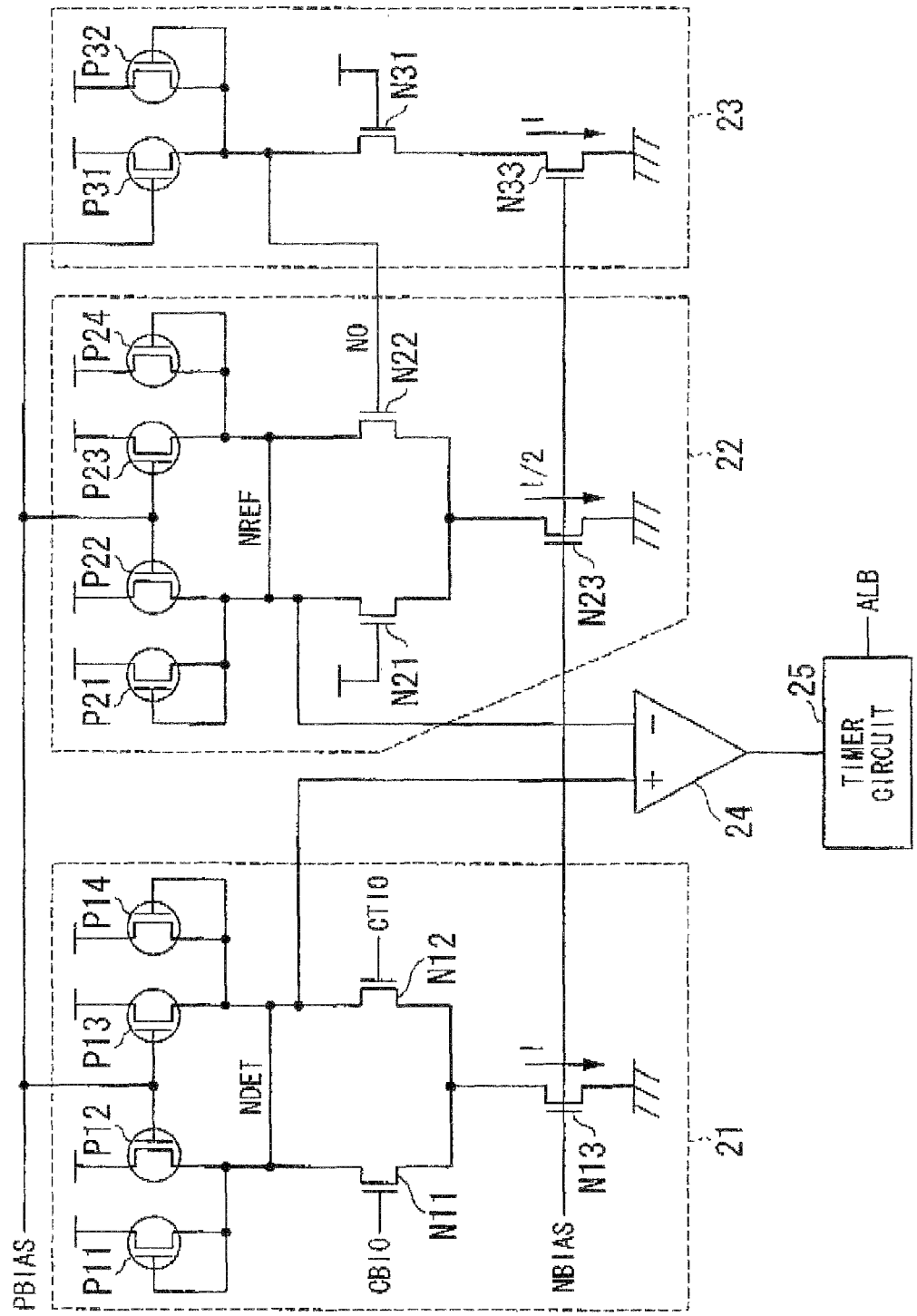
FIG. 3 is a circuit diagram that shows the circuit configuration of the phase detection portion that is shown in FIG. 1B.

Next, the constitution of a phase detection portion 10, which is a characteristic configuration of the present invention, shall be explained with reference to FIG. 3. FIG. 3 is a conceptual drawing that shows a detailed configuration example of the phase detection portion 10 in FIG. 1B.

The phase detection portion 10 has a function to detect the phase difference of the differential signals of the differential output pair of the differential delay element that is set in advance as the object for detection, and has a detection circuit 21 (differential element), a reference voltage generating circuit 22, a Vlow generating circuit 23, a comparator 24, and a timer circuit 25.

The detection circuit 21 generates a voltage by the phase difference of the differential signals of a pair of differential output terminals and outputs the detection result as a differential voltage to a non-inversed input terminal of the above-mentioned comparator 24.

The reference voltage generating circuit 22 generates a threshold voltage for comparing with the above-mentioned differential voltage, i,e., a reference voltage that is set to a voltage that detects abnormal operation, and outputs it to an inversed input terminal of the comparator 24.

The Vlow generating circuit 23 generates a minimum voltage Vlow in the amplitude of a differential signal, to be used for generation of the threshold voltage by the reference voltage generating circuit 22.

The comparator 24 compares the differential voltage input into the non-inversed input terminal with the threshold voltage input into the inversed input terminal, and detects the phase difference of the differential signals in a differential output pair. In this embodiment, when the differential voltage exceeds the threshold voltage, a determination is made of having of having lapsed into the false oscillation state of "problem 1."

Below, the constitution of each circuit of the phase detection portion 10 shall be explained in detail.

The detection circuit 21 consists of N-channel type MOS transistors N11, N12, and N13, and P-channel type MOS transistors P11, P12, P13, P14, and has the same constitution as the differential delay element of FIG. 2A (including the transistor size of the transistors disposed at the same positions by the corresponding circuit configuration). The points of difference are that there is no cross-coupled circuit 20, and the differential outputs are short circuited by the junction point NDET.

The MOS transistor P11 is a diode-connected transistor in which the gate is connected to the drain, and is connected in parallel with the MOS transistor P12, with the source being connected to the power supply line, and the drain being connected to the junction point NDET.

In the MOS transistor P12, the bias voltage PBIAS is impressed on the gate, the source is connected to the power supply line, and the drain is connected to the junction point NDET.

The load of the MOS transistor N11, which is a differential transistor, is formed by the MOS transistor P11 and the MOS transistor P12 mentioned above.

The MOS transistor P14 is a diode-connected transistor in which the gate is connected to the drain, and is connected in parallel with the MOS transistor P13, with the source being connected to the power supply line, and the drain being connected to the junction point NDET.

In the MOS transistor P13, the bias voltage PBIAS is impressed on the gate, the source is connected to the power supply line, and the drain is connected to the junction point NDET.

The load of the MOS transistor N12, which is a differential transistor, is formed by the MOS transistor P13 and the MOS transistor P14 mentioned above.

In the MOS transistor N11, the drain is connected to the junction point NDET, and the gate is connected to the differential input CBI0.

In the MOS transistor N12, the drain is connected to the junction point NDET, and the gate is connected to the differential input CTI0.

In the MOS transistor N13, the source is grounded, the bias voltage NBIAS is impressed on a gate, and the drain is connected to the source of the MOS transistors N11 and N12.

Due to the fact that the present embodiment has the constitution of the differential signal CB8 being input to the differential input CBI0, or the differential signal CT8 being input to the differential input CTI0 with the constitution above, the differential voltage differs in the false oscillation mode and the normal oscillation mode.

That is, during the false oscillation mode, as the phases of the differential signal CB8 and the differential signal CT8 approach a similar state, the voltage of the junction point NDET, that is, the differential voltage, rises. In contrast, during normal operation, as the phases of the differential signal CB8 and the differential signal CT8 approach a shift of 180 degrees, the differential voltage becomes low. Here, when the VCO of FIG. 1A eaters the false oscillation state, the differential signals CT8 and CB8 oscillate in the same phase, and so the differential voltage in the detection circuit 21 will oscillate with the same amplitude as the differential signals CT1 and CB1 that are output from the differential output pair of the differential delay element 1.

The reference voltage generating circuit 22 consists of N-channel type MOS transistors N21, N22, N23, and P-channel type MOS transistors P21, P22, P23, P24, and has the same constitution as the differential delay element of FIG. 2A (including the transistor size of the transistors disposed at the same positions by the corresponding circuit configuration). The points of difference are that there is no cross-coupled circuit 20, and the differential outputs are short circuited by the junction point NREF.

The MOS transistor P21 is a diode-connected transistor in which the gate is connected to the drain, and is connected in parallel with the MOS transistor P22, with the source being connected to the power supply line, and the drain being connected to the junction point NREF.

In the MOS transistor P12, the bias voltage PBIAS is impressed on the gate, the source is connected to the power supply line, and the drain is connected to the junction point NREF.

The load of the MOS transistor N21, which is a differential transistor, is formed by the MOS transistor P21 and the MOS transistor P22 mentioned above.

The MOS transistor P24 is a diode-connected transistor in which the gate is connected to the drain, and is connected in parallel with the MOS transistor P23, with the source being connected to the power supply line, and the drain being connected to the junction point NREF.

In the MOS transistor P23, the bias voltage PBIAS is impressed on the gate, the source is connected to the power supply line, and the drain is connected to the junction point NREF.

The load of the MOS transistor N22, which is a differential transistor, is formed by the MOS transistor P23 and the MOS transistor P24 mentioned above.

In the MOS transistor N21, the drain is connected to the junction point NREF, and the power supply voltage VDD is impressed on the gate.

In the MOS transistor N22, the drain is connected to the junction point NREF, and the minimum voltage Vlow, which is output by the Vlow generating circuit 23, is impressed on the gate (connected to the junction point N0).

In the MOS transistor N23, the source is grounded, the bias voltage NBIAS is impressed on a gate, and the drain is connected to the source of the MOS transistors N21 and N22.

According to the constitution above, in the reference voltage generating circuit 22, the value of the load is the same as in the detection circuit 21. However, since Vlow is impressed on the gate of the MOS transistor N22, the current that flows to the MOS transistor N23 is scaled to ½ of that of the MOS transistor N13. Here, if the current that flows to the reference voltage generating circuit 22 were not scaled, the voltage of the junction point NREF would become an intermediate voltage "VDD−(VDD−Vlow)/2" that is between VDD and Vlow. In the present embodiment, since the current that flows to the MOS transistor N23 is scaled to ½ of that of the MOS transistor N13, the voltage of the junction point NREF, that is, the threshold voltage, becomes "VDD−(VDD−Vlow)/4". Therefore, during normal oscillation, the voltage "VDD−(VDD−Vlow)/4" is imparted as a margin with respect to the differential voltage "VDD−(VDD−Vlow)/2" that is output from the detection circuit 21. However, to have a margin that does not cause a malfunction, a voltage other than this "VDD−(VDD−Vlow)/4" may serve as the threshold voltage. That is, the margin mentioned above may be set so as to make the scaling ratio (current ratio) an optimal value by the phase difference that is allowed between the differential signals in the differential output pair.

The Vlow generating circuit 23 consists of N-channel type MOS transistors N31 and N33, and P-channel type MOS transistor P31 and P32, and has the same constitution as the combination of loads and differential transistors on one side of the differential delay element of FIG. 2A (including the transistor size of the transistors disposed at the same positions by the corresponding circuit configuration).

The MOS transistor P32 is a diode-connected transistor in which the gate is connected to the drain, and is connected in parallel with the MOS transistor P31, with the source being connected to the power supply line, and the drain being connected to the junction point N0.

In the MOS transistor P31, the bias voltage PBIAS is impressed on the gate, the source is connected to the power supply line, and the drain is connected to the junction point N0.

The load of the MOS transistor N31, which is a differential transistor, is formed by the MOS transistor P31 and the MOS transistor P32 mentioned above.

In the MOS transistor N31, the drain is connected to the junction point N0, and the power supply voltage VDD is impressed on the gate.

In the MOS transistor N33, the source is grounded, the bias voltage NBIAS is impressed on a gate, and the drain is connected to the source of the MOS transistor N31.

According to the constitution mentioned above, the load is ½. Since VDD is impressed on the gate of the MOS transistor N31, similarly to the case of the maximum voltage in the amplitude of the differential signal, that is VDD, being input, the Vlow generating circuit 23 outputs the minimum voltage Vlow (maximum voltage) to the contact point N0.

When a rising edge that shifts from the "L" level to the "H" level is input to the input terminal, the timer circuit 25 shifts the voltage of the output terminal from the "H" level to the "L" level. When a falling edge that shifts from the "H" level to the "L" level is input to the input terminal, the timer circuit 25 maintains the voltage of the output terminal at the "L" level state for a set time T that is set in advance with this edge as a trigger. Also, when a new rising edge is input during the abovementioned set time, the count is reset at that time, and a new count is newly started.

That is, when a rising edge is input to the input terminal, the timer circuit 25 changes the voltage of the output terminal from the "H" level to the "L" level, and thereafter when a falling edge is input to the input terminal, it starts the time count and when the counted time becomes the set time, causes the voltage of the output terminal to change from the "L" level to the "H" level.

Figure 4:
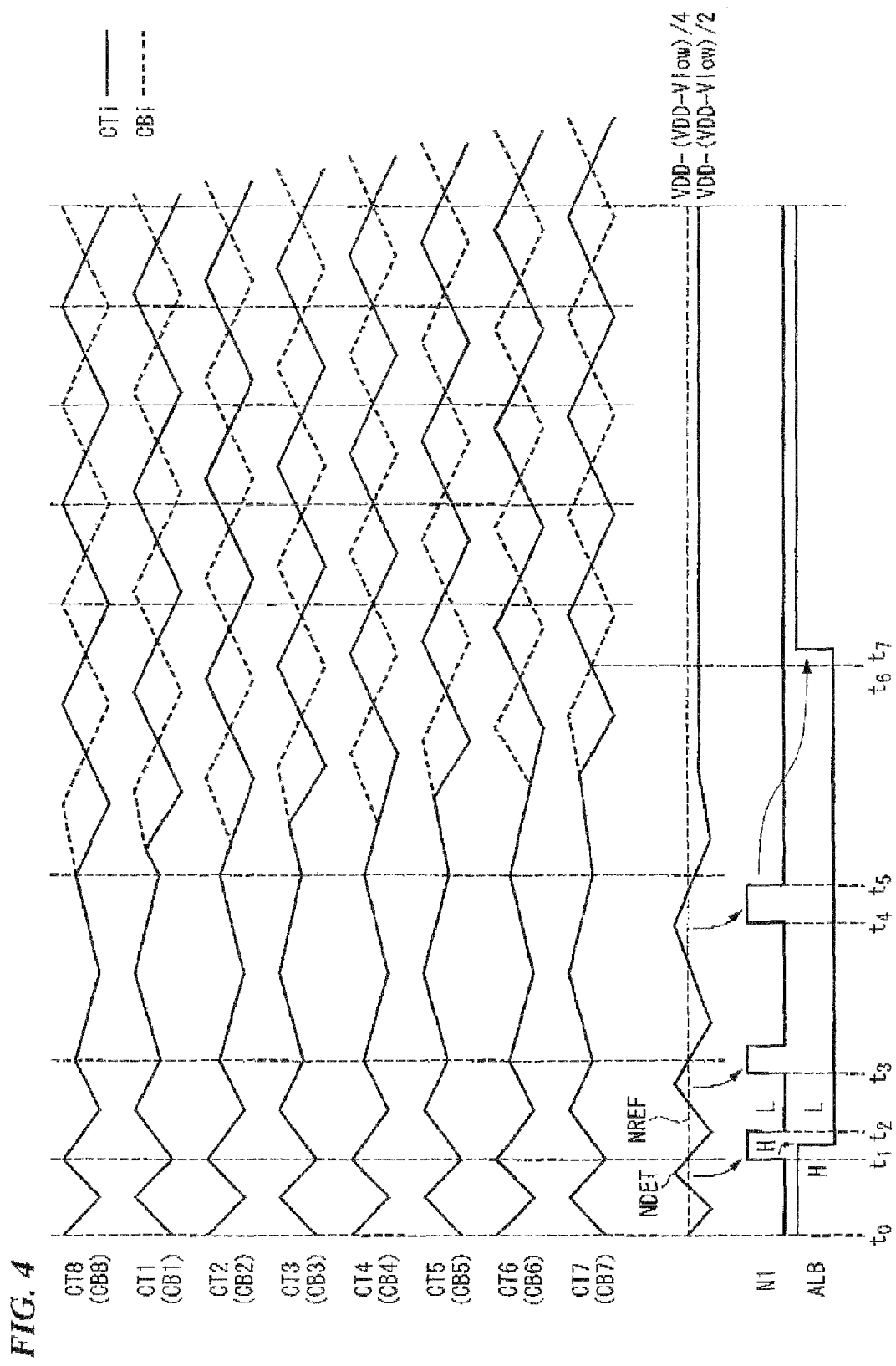
FIG. 4 is a waveform chart that shows the operation of the VCO that is shown in FIG. 1A.

Next, referring to FIG. 3 and FIG. 4, the operation of the VCO in the first embodiment shall be described. FIG. 4 is a waveform chart that shows the operation example of the VCO in the first embodiment.

In the description below, the VDO of the present embodiment is presumed to have fallen into a false oscillation state at time t0. For this reason, the VCO oscillates at a frequency in the false oscillation state.

At time t1, the comparator 24 detects that the peak (maximum voltage of the amplitude) of the differential voltage in the first cycle that has entered the false oscillation state has exceeded the threshold voltage and outputs an. "H" level pulse to the timer circuit 25.

Thereby, the timer circuit 25 causes the detection signs ALB to shift from the "H" level to the "L" level in synchronization with the rising edge.

Due to the detection signal ALB becoming the "L" level and the MOS transistors P6 and P8 being put in the ON state, the cross-coupled circuit 20 is activated. Thereby, positive feedback is applied to both differential output terminals CTO (1 to 8) and CBO (1 to 8) in each differential delay element.

As a result, the differential signals CT (1 to 8) and differential signals CB (1 to 8) that had been stable at the VDD in the differential output terminals CTO (1 to 8) and differential output terminals CBO (1 to 8) enter an unstable state, and gradually change from the same phase of the metastable state to a state that has a phase difference.

Then, at time t2, the timer circuit 25 starts the count of time by the falling edge being input.

At time t3, the VCO, without having completely escaped from the metastable state, oscillates with the differential output terminal CTO1 (and 2 to 8) and differential output terminal CBO1 (and 2 to 8) in the same phase.

For this reason, the comparator 24 detects that the peak of the differential signals of the next cycle has exceeded the threshold voltage, and outputs the "H" level pulse to the timer circuit 25.

The timer circuit 25 resets the time that is counted by the rising edge of the new "H" level pulse, and starts a new count, and so continues to output the detection signal ALB in the "L" level state.

At time t4, at the differential output terminal CTO and the differential output terminal CBO, the differential signal CT and the differential signal CB of the same phase enter an unstable state, and gradually change from the same phase of the metastable state to a state having a phase difference. Therefore, a change in the oscillating frequency begins to arise in the false oscillation state.

However, similarly to the time t4, the VCO, without having completely escaped from the metastable state, oscillates with the differential output terminal CTO and differential output terminal CBO in the same phase in each differential delay element.

For this reason, the comparator 24 detects that the peak of the differential signals of the next cycle has exceeded the threshold voltage, and outputs the "H" level pulse to the timer circuit 25.

At time t5, the VCO changes from the same phase of the metastable state to the state having mostly a phase difference. However, the timer circuit resets the time count result by a new falling edge being input, and starts a new count, and so outputs the detection signal ALB at the "L" level as before.

At time t6, the VCO shifts to the normal oscillation state.

At time t7, since the count result has exceeded the set time T, the timer circuit 25 causes the detection signal ALB to shift from the "L" level to the "H" level.

Thereby, the cross-coupled circuit 20 shifts from an active state to an inactive state as a result of the MOS transistors P6 and P8 entering the OFF state.

That is, after phase difference detection cannot be performed by the comparator 24 from the above delay time, until sufficiently returning to a normal state, the cross-coupled circuit 20 is activated, and the unstable state of the differential output pair of the differential delay elements is positively fed back and shifted to a different phase (that is, a phase that differs by 180 degrees).

With the operation outlined above, when the VCO according to the present embodiment enters a false oscillation state in which the phase of the differential signals that are output from the differential output pair of the differential delay element become similar, by activating the cross-coupled circuit 20 and positively feeding back the unstable state of the differential output pair of the differential delay element, it can be returned to the normal oscillation state.

Note that in the present embodiment, the threshold voltage was given as "DD–(VDD–Vlow)/4" for convenience, as described above the current scaling ratio can be set from ½ to an optimal value by measurement through experimentation.

Also in the operation of the normal oscillation mode, noise is output from the comparator 24 due to a glitch or the like that occurs at the junction point NDET of the detection circuit 21, and due to a malfunction of the timer circuit 25 the cross-coupled circuit 20 operates. In order to prevent this a low-pass filter may be interposed between the output terminal of the comparator 24 and set terminal S of a latch 26.

Also, because the cross-coupled circuit is put in an activated or deactivated state when the detection signal ALB is in the "L" level and the "H" level the delay time of the differential delay elements changes, and the traveling periods of a differential signals will differ.

Accordingly, when the cross-coupled circuit 20 is deactivated, in order to prevent the traveling period from suddenly fluctuating and shifting from the locked frequency, in the case of shifting the detection signal ALB from the "L" level to the "H" level, it is effective to have a configuration that gradually causes a shift with a gradient.

Second Embodiment

Figure 5A:
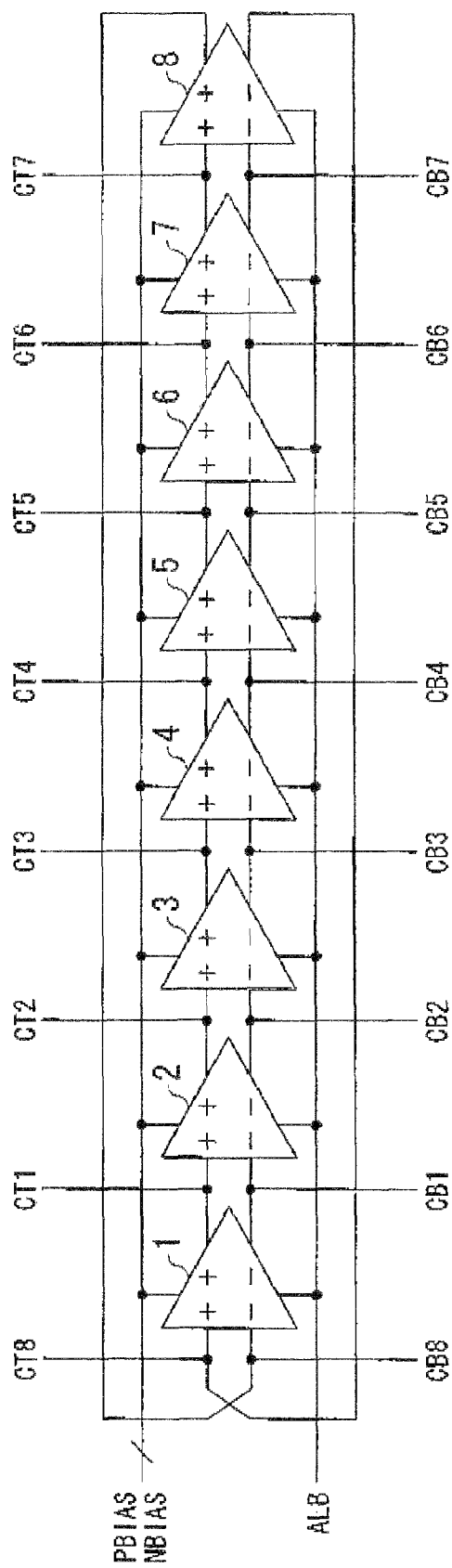
FIG. 5A is a circuit diagram that shows the VCO according to the second embodiment of the present invention.

Next, a differential oscillator type voltage controlled oscillator (VCO) according to the second embodiment of the present invention shall be described with reference to the drawings. FIG. 5A is a conceptual drawing that shows the constitution of the differential ring oscillator according to the second embodiment. The differential delay elements 1, 2, 3, 4, 5, 6, 7, and 8 of the same constitution as those in the first embodiment are connected in cascade.

Figure 5B:
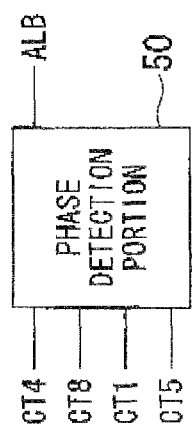
FIG. 5B is a circuit diagram that shows the VCO according to the second embodiment of the present invention.
Figure 6:
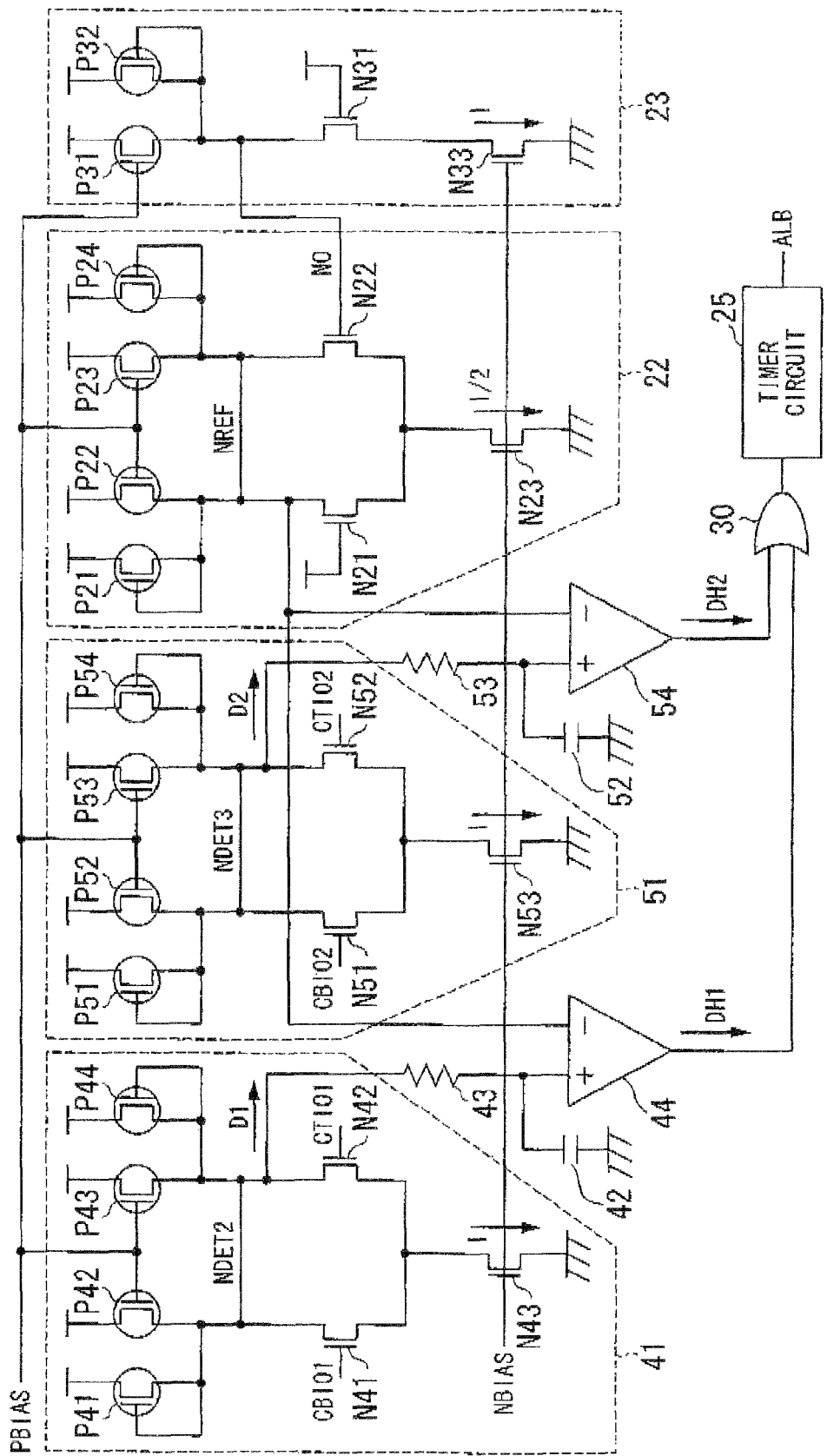
FIG. 6 is a circuit diagram that shows the circuit configuration of the phase detection portion that is shown in FIG. 5A.

The second embodiment differs from the first embodiment on the point of a phase detection portion 50 shown in FIG. 5B and FIG. 6 being provided in place of the phase detection portion 10 in the first embodiment. Hereinbelow, the constitution of this phase detection portion 50 that differs shall be described using FIG. 6.

In the phase detection portion 50 of FIG. 6, the reference voltage generating circuit 22 and the Vlow generating circuit 23 have the same reference numbers and same constitutions as in the first embodiment.

Also, a detection circuit 41 and a detection circuit 51 have the same constitution as the detection circuit 21 of the first embodiment, and the transistor sizes of the MOS transistors positioned at corresponding positions are also the same.

The detection circuit 41 generates a voltage by the phase difference between the differential signals CT4 and CT8, that is, the differential signals of the even-numbered differential delay elements, and outputs the detection result as a differential voltage D1 to a non-inversed input terminal of the above-mentioned comparator 24.

The detection circuit 51 generates a voltage by the phase difference between the differential signals CT1 and CT5, that is, the differential signals of the odd-numbered differential delay elements, and outputs the detection result as a differential voltage D2 to a non-inversed input terminal of the above-mentioned comparator 24.

Here, among the differential output pairs, in the event of falling into the metastable state in which the differential output terminal pair CTOi, CBOi (i is an even number) in the even-numbered differential delay elements all become VDD, the differential output pair CTOj, CBOj (j is an odd number) in the odd-numbered differential delay elements become Vlow (low-voltage level). On the other hand, in the event of falling into the metastable state in which the differential output terminal pair CTOi, CBOi (i is an even number) in the even-numbered differential delay elements all become Vlow, the differential output pair CTOj, CBOj (j is an odd number) in the odd-numbered differential delay elements become VDD. Although it is acceptable to provide the differential signals from either of the differential output terminal CTO or CBO to the detection circuits 41 and 51, in the present embodiment the differential output terminal CTO is used as one example.

Below, the constitutions of each circuit of the detection circuit 41 and the detection circuit 51 shall be explained in detail.

The detection circuit 41 consists of N-channel type MOS transistors N41, N42, and N43, and P-channel type MOS transistors P41, P42, P43, P44, and has the same constitution as the differential delay element of FIG. 2A (including the transistor size of the transistors disposed at the same positions by the corresponding circuit configuration). The points of difference are that there is no cross-coupled circuit 20, and the differential outputs are short circuited by the junction point NDET2.

The MOS transistor P41 is a diode-connected transistor in which the gate is connected to the drain, and is connected in parallel with the MOS transistor P42, with the source being connected to the power supply line, and the drain being connected to the junction point NDET2.

In the MOS transistor P42, the bias voltage PBIAS is impressed on the gate, the source is connected to the power supply line, and the drain is connected to the junction point NDET2.

The load of the MOS transistor N41, which is a differential transistor, is formed by the MOS transistor P41 and the MOS transistor P42 mentioned above.

The MOS transistor P44 is a diode-connected transistor in which the gate is connected to the drain, and is connected in parallel with the MOS transistor P43, with the source being connected to the power supply line, and the drain being connected to the junction point NDET2.

In the MOS transistor P43, the bias voltage PBIAS is impressed on the gate, the source is connected to the power supply line, and the drain is connected to the junction point NDET2.

The load of the MOS transistor N42, which is a differential transistor, is formed by the MOS transistor P43 and the MOS transistor P44 mentioned above.

In the MOS transistor N41, the drain is connected to the junction point NDET2, and the gate is connected to the differential input CBI01.

In the MOS transistor N42, the drain is connected to the junction point NDET2, and the gate is connected to the differential input CTI01.

In the MOS transistor N43, the source is grounded, the bias voltage NBIAS is impressed on a gate, and the drain is connected to the source of the MOS transistors N41 and N42.

The detection circuit 51 consists of N-channel type MOS transistors N51, N52, and N53, and P-channel type MOS transistors P51, P52, P53, P54, and has the same constitution as the differential delay element of FIG. 2A (including the transistor size of the transistors disposed at the same positions by the corresponding circuit configuration). The points of difference are that there is no cross-coupled circuit 20, and the differential outputs are short circuited by the junction point NDET2.

The MOS transistor P51 is a diode-connected transistor in which the gate is connected to the drain, and is connected in parallel with the MOS transistor P52, with the source being connected to the power supply line, and the drain being connected to the junction point NDET3.

In the MOS transistor P52, the bias voltage PBIAS is impressed on the gate, the source is connected to the power supply line, and the drain is connected to the junction point NDET3.

The load of the MOS transistor N51, which is a differential transistor, is formed by the MOS transistor P51 and the MOS transistor P52 mentioned above.

The MOS transistor P54 is a diode-connected transistor in which the gate is connected to the drain, and is connected in parallel with the MOS transistor P53, with the source being connected to the power supply line, and the drain being connected to the junction point NDET3.

In the MOS transistor P53, the bias voltage PBIAS is impressed on the gate, the source is connected to the power supply line, and the drain is connected to the junction point NDET3.

The load of the MOS transistor N52, which is a differential transistor, is formed by the MOS transistor P53 and the MOS transistor P54 mentioned above.

In the MOS transistor N51, the drain is connected to the junction point NDET3, and the gate is connected to the differential input CBI02.

In the MOS transistor N52, the drain is connected to the junction point NDET3, and the gate is connected to the differential input CTI02.

In the MOS transistor N53, the source is grounded, the bias voltage NBIAS is impressed on a gate, and the drain is connected to the source of the MOS transistors N51 and N52.

According to the constitution given above, since the detection circuit 41 of the present embodiment has the constitution of the differential signal CT4 being input to the differential input CBI01, and the differential signal CT8 being input to the differential input CTI01, when in a metastable state, in the case that the even-numbered differential outputs are fixed by Vlow, the voltage of the junction point NDET2 becomes VDD, and in the case that the even-numbered differential outputs are fixed by the "H" level, the voltage of the junction point NDET2 becomes Vlow.

Also since the detection circuit 51 of the present embodiment has the constitution of the differential signal CT5 being input to the differential input CBI02, and the differential signal CT1 being input to the differential input CTI02, when in a metastable state, in the case that the odd-numbered differential outputs are fixed by Vlow, the voltage of the junction point NDET3 becomes VDD, and in the case that the odd-numbered differential outputs are fixed by VDD, the voltage of the junction point NDET3 becomes Vlow.

Thereby, even if the odd-numbered or even-number differential delay elements enter the metastable state by any voltage state, detection thereof is possible by the detection circuits 41 and 51.

In a comparator 44, the threshold voltage is input from the reference voltage generating circuit 22 to the inversed input terminal, and the non-inversed input terminal is connected to the junction point NDET2 via a resistor 43.

Also, a condenser 42 is interposed between the non-inversed input terminal of the comparator 44 and the junction point. That is, in order to prevent noise such as a glitch that occurs in the junction point NDET2 from being input to the non-inversed input terminal during normal oscillation, a low pass filter is formed by the aforementioned resistor 43 and the condenser 42.

Also, the comparator 44 compares the differential voltage D1 input into the non-inversed input terminal with the threshold voltage input to the inversed input terminal, and outputs a signal DH1 of the "H" level when the differential voltage D1 exceeds the threshold voltage.

In a comparator 54, the threshold voltage from the reference voltage generating circuit 22 is input to the inversed input terminal, and the non-inversed input terminal is connected to the junction point NDET3 via a resistor 53.

Also, a condenser 52 is interposed between the non-inversed input terminal of the comparator 54 and the junction point. That is, in order to prevent noise such as a glitch that occurs in the junction point NDET4 from being input to the non-inversed input terminal during normal oscillation, a low pass filter is formed by the aforementioned resistor 53 and the condenser 52.

Also, the comparator 54 compares the differential voltage D2 input into the non-inversed input terminal with the threshold voltage input to the inversed input terminal, and outputs a signal DH2 of the "H" level when the differential voltage D2 exceeds the threshold voltage.

A NOR circuit 30 changes the voltage of the output terminal from the "L" level to the "H" level when either of the signal DH1 or signal DH2 of the "H" level is input from the state of any input being the "L" level.

The timer circuit 25 starts the timer operation with the rising edge that is input from the NOR circuit 30 serving as a trigger.

Figure 7:
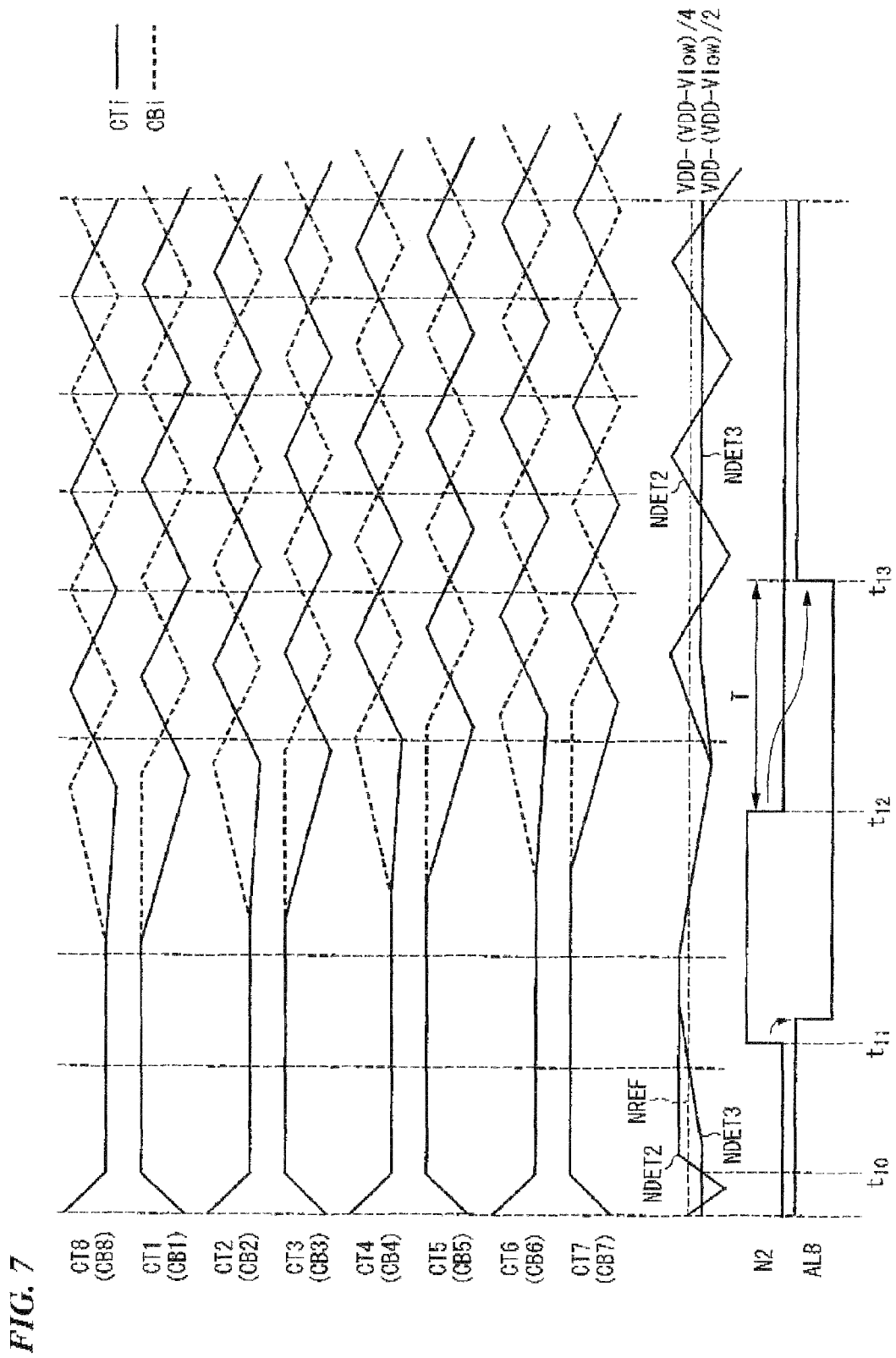
FIG. 7 is a waveform chart that shows the operation of the VCO that is shown in FIG. 5A.
Figure 8A:
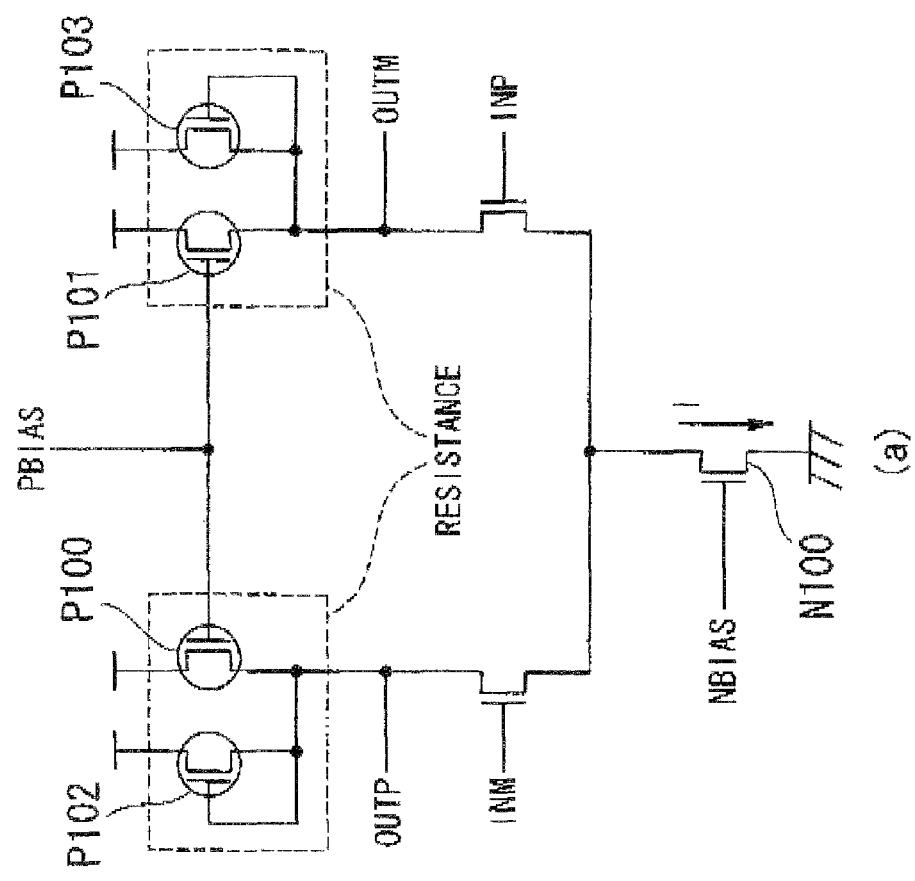
FIG. 8A is a circuit diagram that shows the circuit configuration of a conventional differential delay element.
Figure 8B:
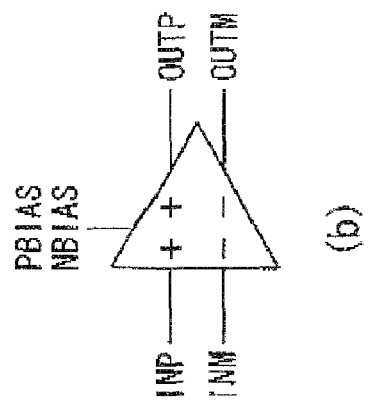
FIG. 8B is a circuit diagram that shows a conventional differential delay element
Figure 9:
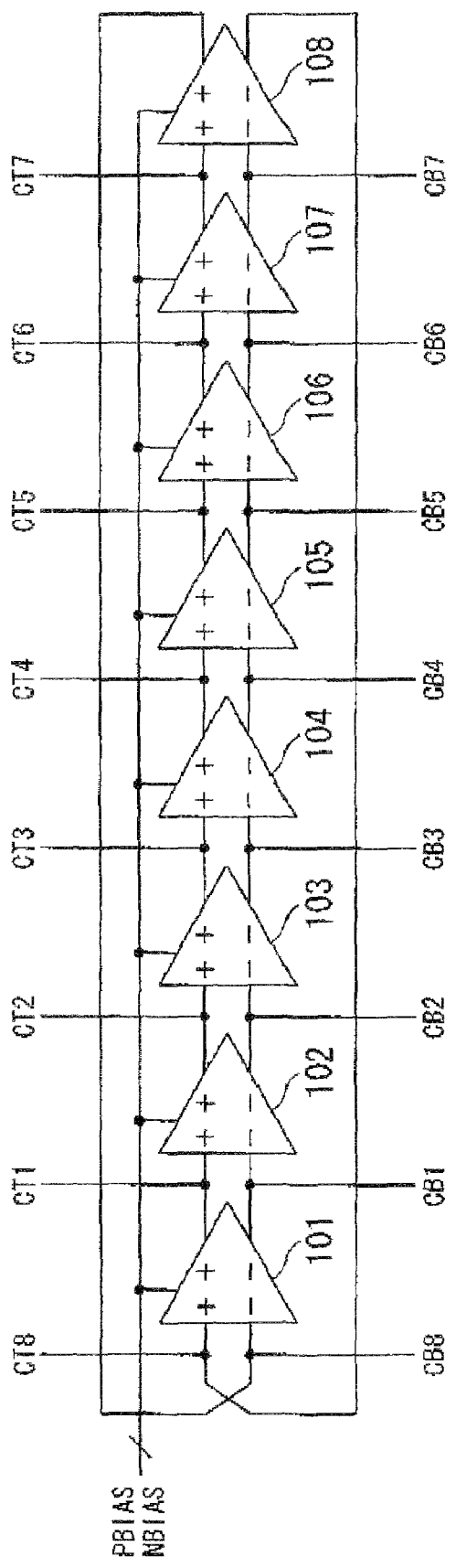
FIG. 9 is a circuit diagram that shows the circuit configuration of the VCO that is formed using the differential delay element that is shown in FIG. 8B.
Figure 10:
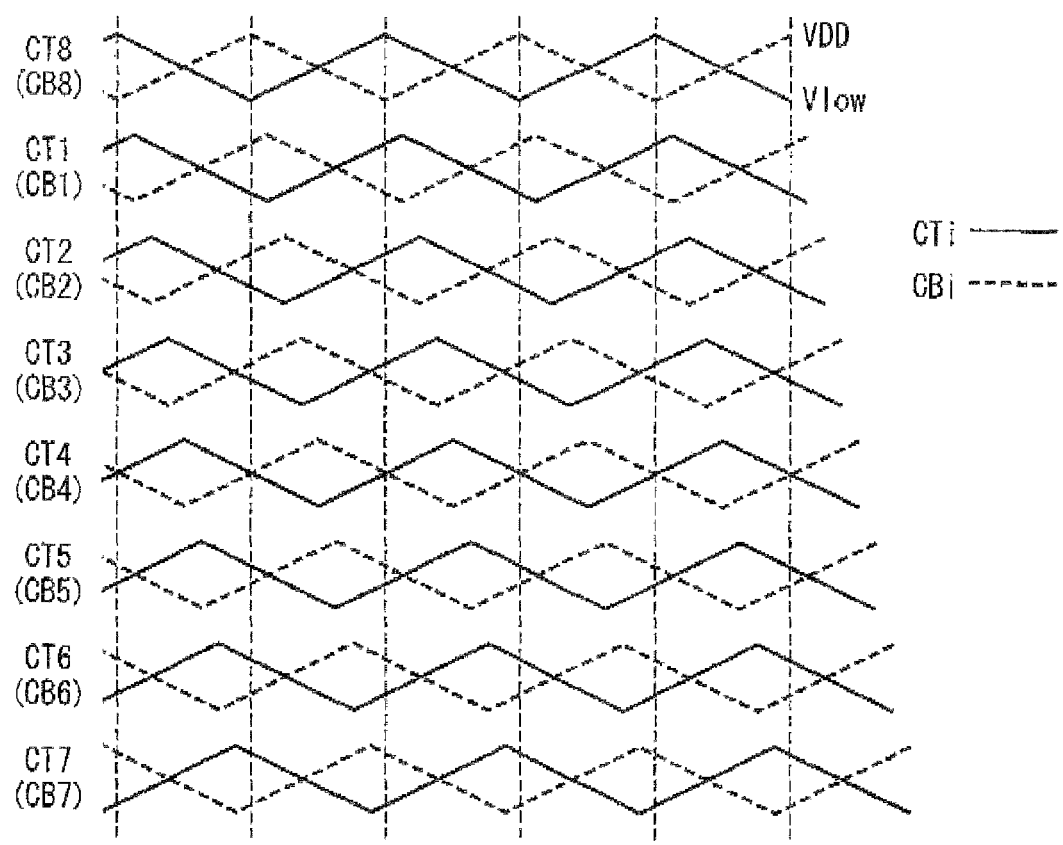
FIG. 10 is a waveform chart that shows the operation of the normal oscillation state of the VCO.
Figure 11:
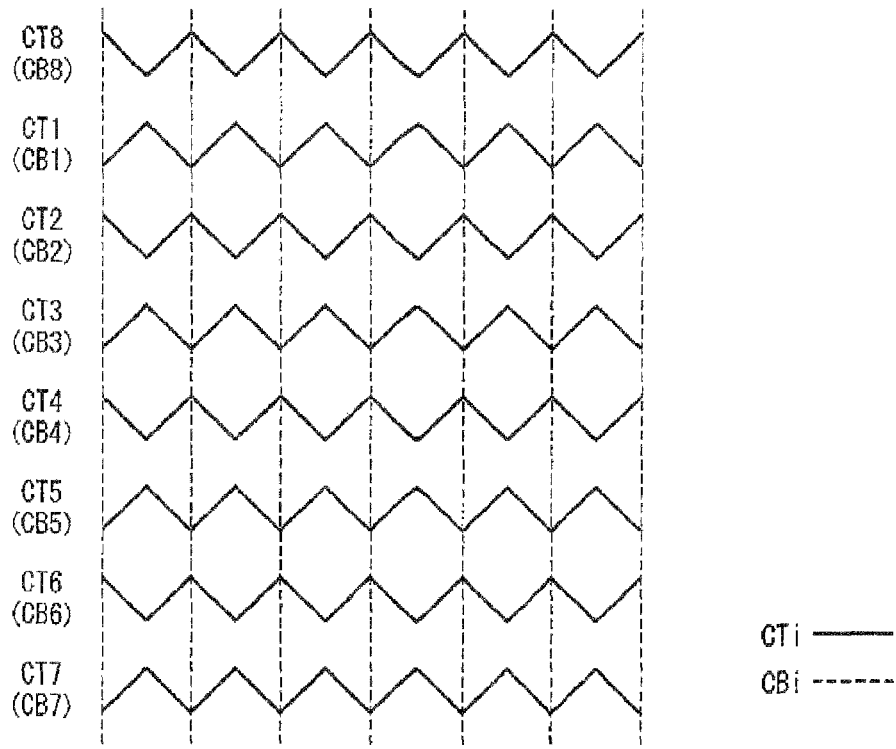
FIG. 11 is a waveform chart that shows the operation of the false oscillation state in a conventional VCO (first problem).
Figure 12:
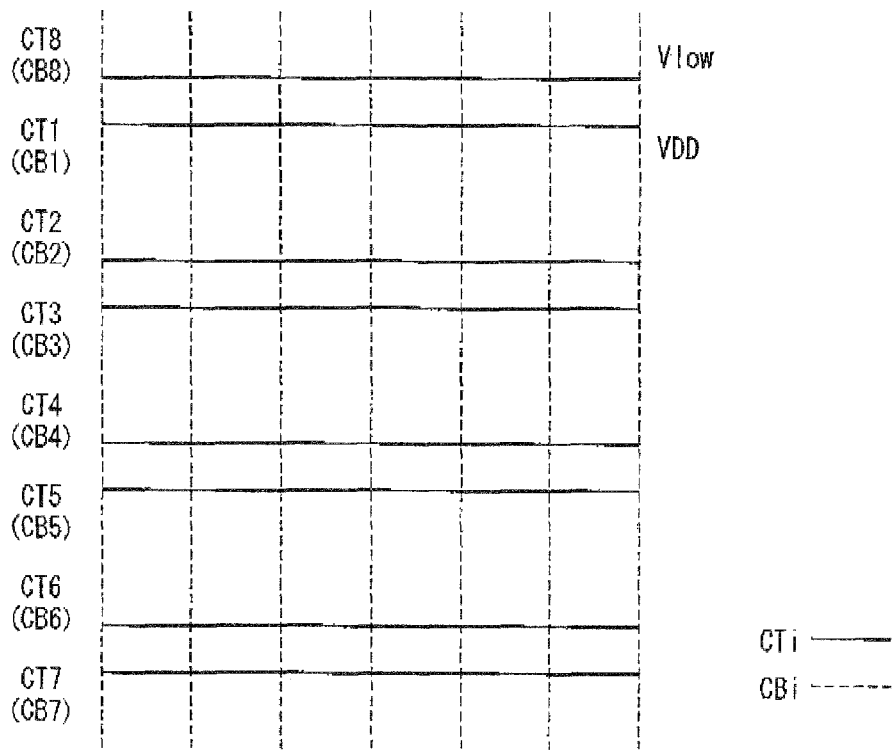
FIG. 12 is a waveform chart that shows the operation of the metastable state in a conventional VCO (second problem).

Next, referring to FIG. 5A, FIG. 6 and FIG. 7 the operation of the VCO in the second embodiment shall be described. FIG. 7 is a waveform chart that shows the operation of the VCO in the first embodiment.

In the description below, the VDO of the present embodiment is presumed to have fallen into a metastable state at time t10. Because it is in the metastable state, the oscillation operation is not being performed.

At time t10, when for example both the oscillation signals CT8 and CT4 become Vlow, the differential voltage D1 becomes VDD, when both the oscillation signals CT1 and CT5 become VDD, the differential voltage D2 becomes Vlow.

At time t11, the condenser 42 in the low pass filter is charged, and VDD is input to the non-inversed input terminal of the comparator 44.

Thereby, the comparator 24 detects that the differential signal D1 that is input to the non-inversed input terminal has exceeded. The threshold voltage that is input to the inversed input terminal, and changes the voltage of the output terminal from the "L" level to the "H" level.

Here, since the "H" level signal (signal HD1) is input to one input terminal, the NOR circuit 30 changes the voltage of the output terminal from the "L" level to the "H" level.

As a result, due to the rising edge being input to the input terminal, the timer circuit 25 causes the voltage of the output terminal, that is, the detection signal ALB, to change from the "H" level to the "L" level in synchronization with the rising edge.

Due to the detection signal ALB becoming the "L" level, and the MOS transistors P6 and P8 being put in the ON state, the cross-coupled circuit 20 is activated. Thereby, positive feedback is applied to both differential outputs CTO (1 to 8) and CBO (1 to 8) in each differential delay element.

As a result, the differential signals CT (1 to 8) and differential signals CB (1 to 8) that had been stable at the VDD in the differential output terminals CTO (1 to 8) and differential output terminals CBO (1 to 8) enter an unstable state, and gradually change from the same phase of the metastable state to a state that has a phase difference. That is, CTi and CBi, and CTj and CBj become reverse phases, leading to a state of the signals propagating in turn.

Then, at time t12, the VCO shifts to the normal oscillating state. In this state, the differential voltage D1 of the connection terminal NDET2 oscillates at an intermediate phase at the same cycle. Due to this, the voltage of the non-inversed terminal of the comparator 44 becomes nearly constant at "VDD−(VDD−Vlow)/2" due to the low-pass filter consisting of the resistor 43 and the condenser 42, and thus lower than the threshold voltage "VDD−(VDD−Vlow)/4". As a result, the comparator 24 causes the signal DH1 of the output terminal to change from. "H1" to "L1" when the differential voltage D1 falls below the threshold voltage.

Then, the NOR circuit 30 causes the output to shift from the "H" level to the "L" level since the "L" level signal is input to both of the 2 input terminals.

Thereby, the timer circuit 25 starts the time count from the input of the falling edge to the input terminals.

At time t3, the timer circuit 25 causes the detection signal ALB to shift from the "L" level to the "H" level since the count result has exceeded the set time.

Thereby, the cross-coupled circuit 20 shifts from the active state to the inactive state as the MOS transistors P6 and P8 enter the OFF state.

Both of the phase detection portions 10 and 50 in the second embodiment and the first embodiment are provided in the VCO. That is, the outputs of the comparators 25, 41, 51 are respectively connected to the input terminals of the OR circuit of 3 inputs, and the output terminals are connected to the input terminals of the timer circuit 25. Thereby it is possible to readily realize a VCO that operates in a more stable manner.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A voltage controlled oscillator that is a different ring oscillator type voltage controlled oscillator, comprising:
   a plurality of differential delay elements that each have a pair of differential input terminals, a pair of differential output terminals, and a bias input terminal, with clock signals of a mutually reverse phase input to the pair of differential input terminals;
   a phase detection portion that is connected to the differential output terminals of one differential delay element for detection among the plurality of differential delay elements, detects an abnormal oscillation by comparing an output voltage of the differential output terminals and a reference voltage that is set to a voltage that detects an abnormal operation and outputs a detection signal;

a cross-coupled circuit that is provided at each of the differential delay elements and connected to the phase detection portion, and, when the detection signal is input, amplifies the potential difference between the pair of differential output terminals;

wherein by connecting in cascade the plurality of differential delay elements at the differential input terminals and the differential output terminals and controlling the amount of current that flows to the differential delay elements by a bias voltage that is impressed on the bias input terminal, the voltage controlled oscillator controls the delay amount of the clock signal.

2. The voltage controlled oscillator according to claim 1, wherein each of the differential delay elements has:

a first NMOS transistor, in which the drain is connected to the power supply via a first load, and either of the pair of differential output terminals is connected to the gate;

a second NMOS transistor, in which the drain is connected to the power supply via a second load, and either of the pair of differential output terminals is connected to the gate; and a third NMOS transistor in which the source is grounded, the drain is connected to the source of the first and second MOS transistors, and a first bias voltage is impressed on the gate.

3. The voltage controlled oscillator according to claim 2, wherein each of the first and second loads is formed by a first PMOS transistor that is diode connected and a second PMOS transistor in which a second bias voltage is impressed on the gate being connected in parallel.

4. A voltage controlled oscillator that is a differential ring oscillator type voltage controlled oscillator, comprising:

a plurality of differential delay elements that each have a pair of differential input terminals, a pair of differential output terminals, and a bias input terminal, with clock signals of a mutually reverse phase input to the pair of differential input terminals;

a phase detection portion that is connected to the differential output terminals of one differential delay element for detection among the plurality of differential delay elements, detects an abnormal oscillation by comparing an output voltage of the differential output terminals and a reference voltage that is set to a voltage that detects an abnormal operation and outputs a detection signal;

a cross-coupled circuit that is provided at each of the differential delay elements and connected to the phase detection portion, and, when the detection signal is input, amplifies the potential difference between the pair of differential output terminals;

wherein by connecting in cascade the plurality of differential delay elements at the differential input terminals and the differential output terminals and controlling the amount of current that flows to the differential delay elements by a bias voltage that is impressed on the bias input terminal, the voltage controlled oscillator controls the delay amount of the clock signal, and wherein the phase detection portion includes:

a differential element that has a pair of differential input terminals and a pair of differential output terminals that are short circuited, with a pair of differential output terminals of the differential delay element for detection each connected to the pair of differential input terminals of the differential element, a comparator that compares the voltages of the pair of differential output terminals that are short circuited and a reference voltage; and a timer circuit that outputs the detection signal for a set period, with a pulse that the comparator outputs serving as a trigger.

5. The voltage controlled oscillator according to claim 4, further comprising:

a reference voltage generating circuit that has a pair of differential input terminals and a pair of differential output terminals that are short circuited and has a differential element, wherein one of the pair of differential terminals is connected to a power supply, and the other is connected to a minimum voltage of the output voltage, and the reference voltage generating circuit outputs as a reference voltage one that is found by subtracting from the voltage of the power supply a voltage in which a value calculated by subtracting the minimum voltage from the voltage of the power supply is multiplied by ½.

6. A voltage controlled oscillator that is a differential ring oscillator type voltage controlled oscillator, comprising:

a plurality of differential delay elements that each have a pair of differential input terminals, a pair of differential output terminals, and a bias input terminal, with clock signals of a mutually reverse phase input to the pair of differential input terminals;

a phase detection portion that is connected to the differential output terminals of one differential delay element for detection among the plurality of differential delay elements, detects an abnormal oscillation by comparing an output voltage of the differential output terminals and a reference voltage that is set to a voltage that detects an abnormal operation and outputs a detection signal;

a cross-coupled circuit that is provided at each of the differential delay elements and connected to the phase detection portion, and, when the detection signal is input, amplifies the potential difference between the pair of differential output terminals;

wherein by connecting in cascade the plurality of differential delay elements at the differential input terminals and the differential output terminals and controlling the amount of current that flows to the differential delay elements by a bias voltage that is impressed on the bias input terminal, the voltage controlled oscillator controls the delay amount of the clock signal, and wherein the detection portion includes:

a first differential element and a second differential element that each has a pair of differential input terminals and a pair of differential output terminals that are short circuited, with one of the two differential output terminals of an even-numbered differential delay element for detection among the plurality of differential delay elements each connected to the pair of differential input terminals of the first differential element, and one of the two differential output terminals of an odd-numbered differential delay element for detection among the plurality of differential delay elements each connected to the pair of differential input terminals of the second differential element, a comparator that compares the voltages of the pair of differential output terminals that are short circuited of the first and second differential elements and a reference voltage; and a timer circuit that outputs the detection signal for a set period, with a pulse that the comparator outputs serving as a trigger.

7. The voltage controlled oscillator according to claim 6, further comprising:
a reference voltage generating circuit that has a pair of differential input terminals and a pair of differential output terminals that are short circuited and has a differential element, wherein
one of the pair of differential terminals is connected to a power supply, and the other is connected to a minimum voltage of the output voltage, and the reference voltage generating circuit outputs as a reference voltage one that is found by subtracting from the voltage of the power supply a voltage in which a value calculated by subtracting the minimum voltage from the voltage of the power supply is multiplied by ½.

8. A differential delay element comprising:
first and second input terminals;
first and second output terminals;
first and second voltage terminals;
a first current circuit connected with the first voltage terminal to tune a current source thereof;
a first bias circuit provided between the second voltage terminal and the first output terminal;
a second bias circuit provided between the second voltage terminal and the second output terminal in parallel with the first bias circuit;
a first transistor of which gate electrode is connected with the first input terminal, and provided between the first output terminal and the first current circuit;
a second transistor of which gate electrode is connected with the second input terminal, and provided between the second output terminal and the first current circuit in parallel with the first transistor; and
an amplifying circuit provided between the first and second output terminals, amplifying a potential difference between the first and second output terminals when the amplifying circuit receives a control signal which is active, and not amplifying the potential difference between the first and second output terminals when the amplifying circuit receives the control signal which is inactive.

9. The element as claimed in claim 8, wherein the first current circuit supplies with an additional control signal that is active to tune the current source, the additional control signal being active during the control signal supplied to the amplifying circuit being either active or inactive.

10. A voltage controlled oscillator comprising:
a plurality of differential delay elements, each of the differential delay elements including two input terminals and two output terminals of a preceding one of the differential delay elements are connected respectively to the two input terminals of succeeding one of the differential delay elements, the differential delay elements being supplied in common with a first control signal such that an operation of each of the differential delay elements is controlled by the first control signal;
a detection circuit connected to the two input terminals of at least one of the differential delay elements to produce a second control signal responsive to voltage potentials therebetween independently of the first control signal; and
a cross-coupled circuit coupled between the output terminals of at least one of the differential delay elements and controlled by the second control signal.

* * * * *